United States Patent
Kibune et al.

(10) Patent No.: US 9,509,327 B2
(45) Date of Patent: Nov. 29, 2016

(54) A/D CONVERTER AND A/D CONVERTER CALIBRATING METHOD

(71) Applicant: FUJITSU LIMITED, Kawasaki-shi, Kanagawa (JP)

(72) Inventors: Masaya Kibune, Santa Clara, CA (US); Sanroku Tsukamoto, Setagaya (JP)

(73) Assignee: FUJITSU LIMITED, Kawasak (JP)

( * ) Notice: Subject to any disclaimer, the term of this patent is extended or adjusted under 35 U.S.C. 154(b) by 0 days.

(21) Appl. No.: 15/044,632

(22) Filed: Feb. 16, 2016

(65) Prior Publication Data
US 2016/0173114 A1    Jun. 16, 2016

Related U.S. Application Data

(63) Continuation of application No. PCT/JP2013/076709, filed on Oct. 1, 2013.

(51) Int. Cl.
*H03M 1/10* (2006.01)
*H03M 1/46* (2006.01)

(52) U.S. Cl.
CPC ......... *H03M 1/1009* (2013.01); *H03M 1/1057* (2013.01); *H03M 1/462* (2013.01); *H03M 1/468* (2013.01)

(58) Field of Classification Search
None
See application file for complete search history.

(56) References Cited

U.S. PATENT DOCUMENTS

| | | | |
|---|---|---|---|
| 6,323,792 B1* | 11/2001 | Regier | H03M 1/0612 341/118 |
| 6,987,472 B2* | 1/2006 | Lin | H03M 1/109 341/120 |
| 8,587,466 B2* | 11/2013 | Debnath | H03M 1/145 341/155 |
| 8,706,445 B2* | 4/2014 | Asami | H03M 1/109 341/120 |
| 2003/0179124 A1 | 9/2003 | Harada | |
| 2011/0022341 A1 | 1/2011 | Asami | |

FOREIGN PATENT DOCUMENTS

| | | |
|---|---|---|
| JP | 08-223039 A | 8/1996 |
| JP | 2003-179491 A | 6/2003 |
| JP | 2003-283336 A | 10/2003 |
| JP | 2011-030206 A | 2/2011 |

OTHER PUBLICATIONS

Zhu et al., A 9-bit 100 MS/s SAR ADC with Digitally Assisted Background Calibration, IEICE Trans. Electron., vol. E95-C, No. 6 Jun. 2012.*

(Continued)

*Primary Examiner* — Howard Williams
(74) *Attorney, Agent, or Firm* — Fujitsu Patent Center

(57) ABSTRACT

An A/D converter includes an A/D conversion unit, a histogram generation-storage unit, and a control unit. The A/D conversion unit is configured to receive an input voltage, perform an analog-to-digital conversion, and output digital data, and the histogram generation-storage unit is configured to receive the digital data, generate a histogram for a waveform of the input voltage, and store the generated histogram therein. The control unit is configured to control an analog-to-digital conversion characteristics of the A/D conversion unit, based on the histogram stored in the histogram generation-storage unit.

14 Claims, 15 Drawing Sheets

(56) References Cited

OTHER PUBLICATIONS

Thomas Kugelstadt, "The Operation of the SAR-ADC based on Charge Redistribution," JAJT017 (Japanese Translation of SLYT176), Texas Instruments Japan Limited, pp. 1-4, Nov. 2001, Internet URL: http://www.tij.co.jp/ip/lit/an/jajt017/jajt017.pdf.(6 pages) Corresponding to SLYT176.

Thomas Kugelstadt, "The Operation of the SAR-ADC based on Charge Redistribution," SLYT176, Texas Instruments Incorporated, pp. 10-11, Feb. 2000 (3 pages). Corresponding to JAJT017.

International Search Report and Written Opinion of the International Searching Authority (Form PCT/ISA/210, Form PCT/ISA/237), mailed on Nov. 26, 2013 in connection with PCT/JP2013/076709 (8 pages).

* cited by examiner

FIG. 2
(a)
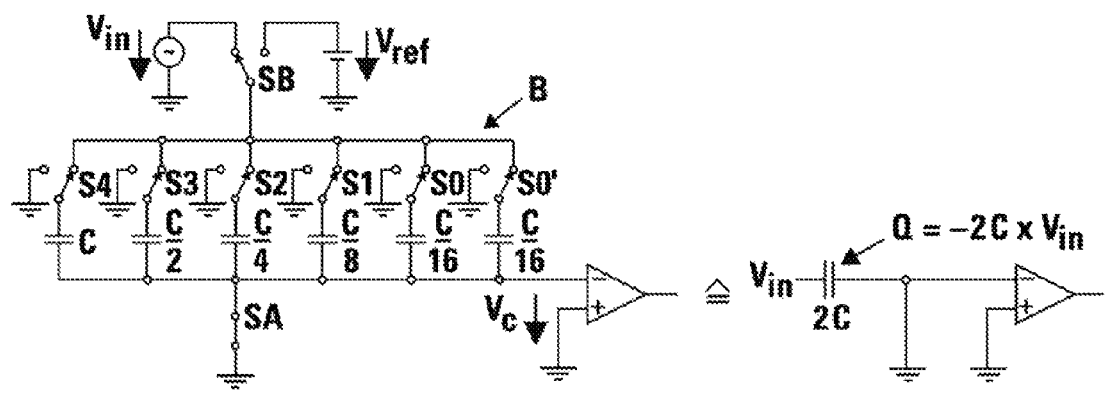
(b)
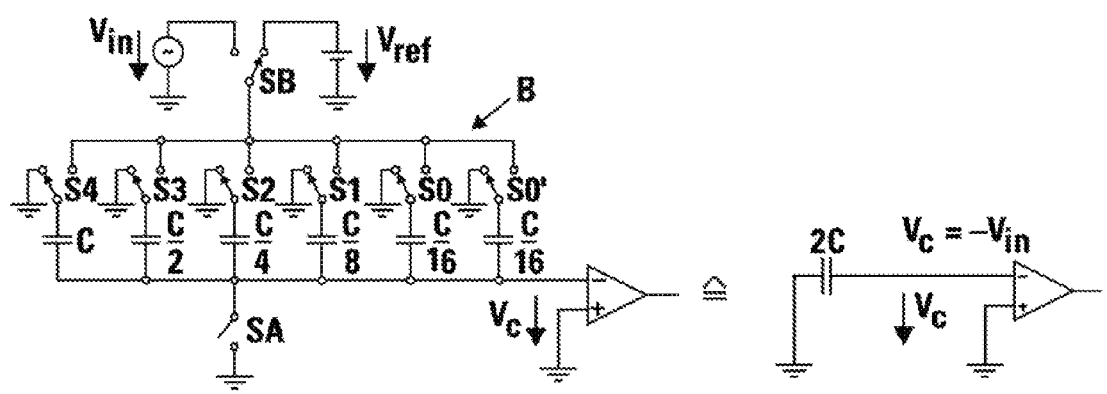

FIG. 3
(a)
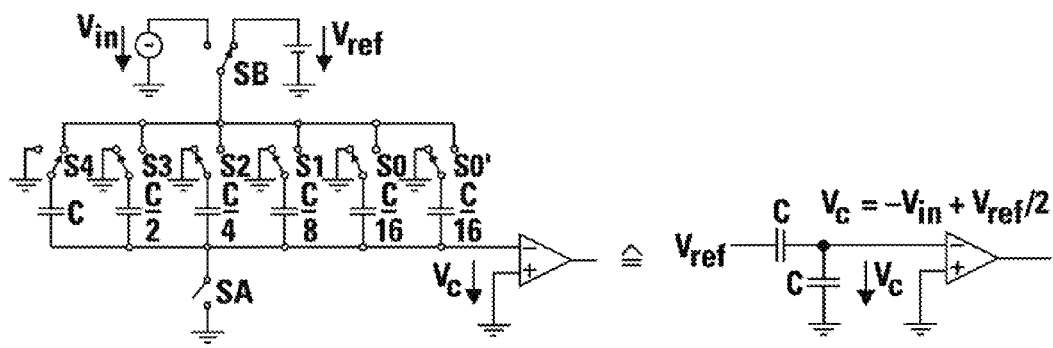
(b)
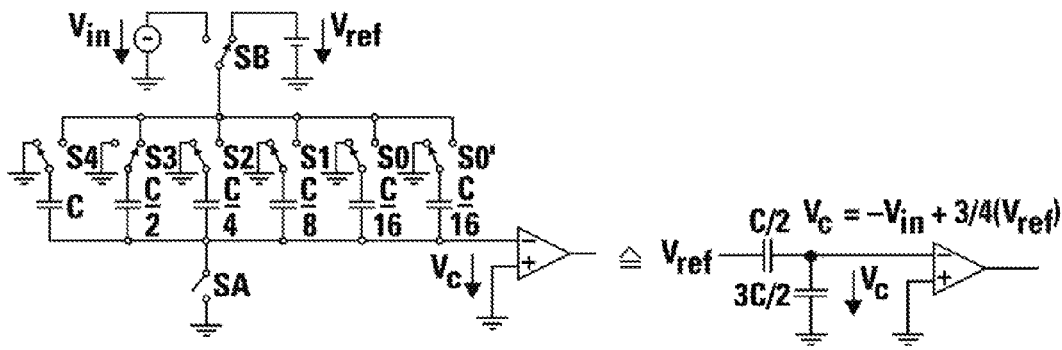
(c)
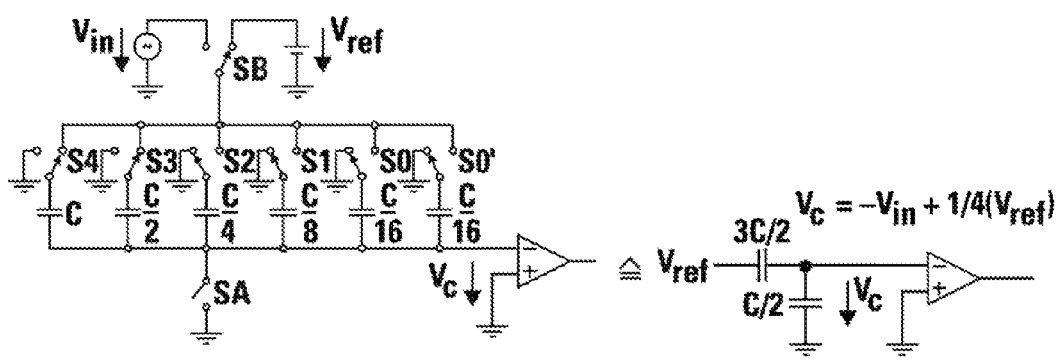

FIG. 6
(a)
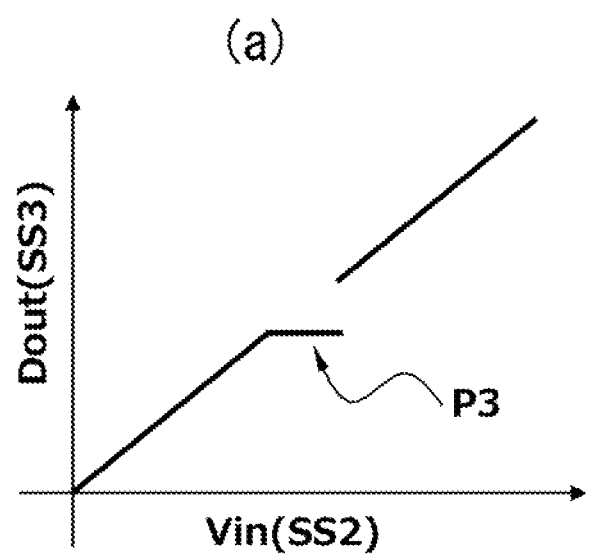
(b)
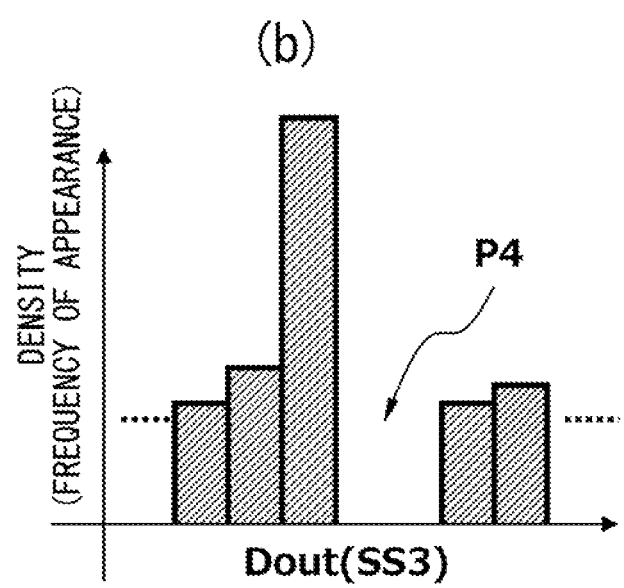

FIG. 15
(a)
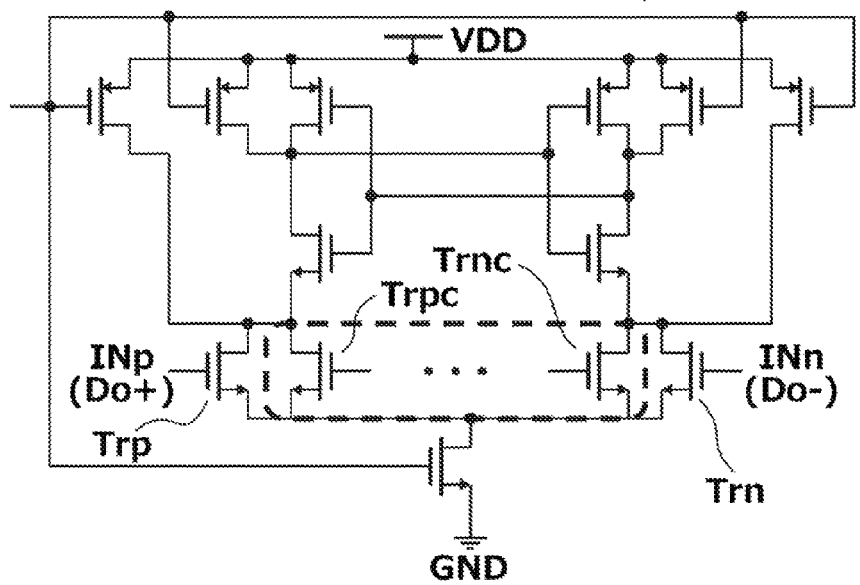
(b)
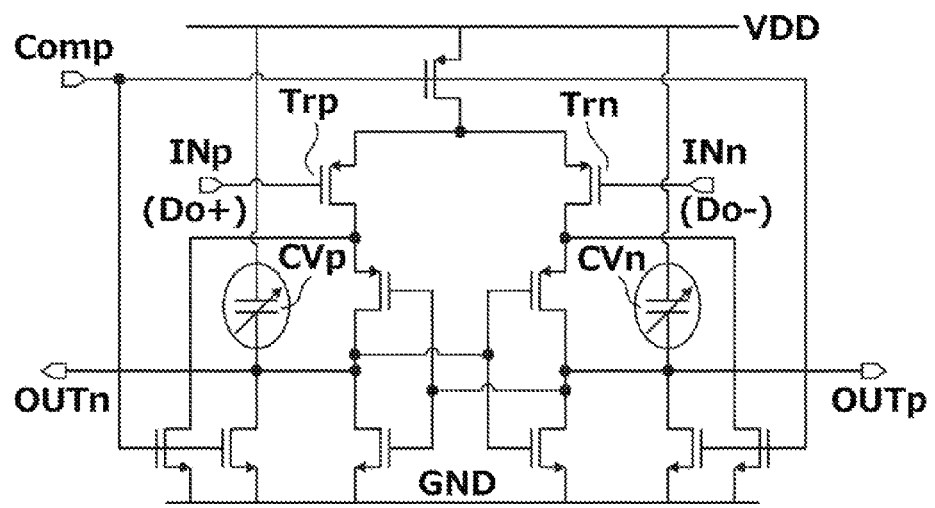

A/D CONVERTER AND A/D CONVERTER CALIBRATING METHOD

CROSS-REFERENCE TO RELATED APPLICATION

This application is a continuation application and is based upon PCT/JP2013/076709, filed on Oct. 1, 2013, the entire contents of which are incorporated herein by reference.

FIELD

Embodiments discussed herein relate to an A/D converter and an A/D converter calibrating method.

BACKGROUND

Successive approximation register (SAR) type analog-to-digital (A/D) converters, which can be implemented by relatively simple circuit configurations, have excellent compatibility with CMOS processes and can be manufactured at relatively low cost, have recently been attracting attention as an A/D converter.

In semiconductor integrated circuits of a CMOS process, for example, when fabricating a successive approximation register type A/D converter, a scheme called as charge redistribution based on a switched capacitor technique is mainly employed. The reason is that a nearly ideal switch can be relatively easily implemented in a CMOS process.

An example of a conventional A/D converter and the operations thereof will be described referring to FIG. 1 to FIG. 3. FIG. 1 to FIG. 3 depict an example of a successive approximation register type A/D converter (SAR-ADC) described later in NPL 1 of [Citation List]. In FIG. 1 to FIG. 3, referential signs SA, SB, S4 to S0, and S0' refer to switches, Vin refers to an analog input voltage, and Dout refers to a digital output (5 bits: $b_4$ to $b_0$).

FIG. 1 is a block diagram depicting an example of a conventional A/D converter and depicts 5-bit SAR-ADC based on charge redistribution using switched capacitor architecture. Capacitors each have a binary weighted value (capacitance: C, C/2, C/4, . . . , $C/2^{n-1}$).

When all of the capacitors from capacitance C to the last two capacitors having the value $C/2^{n-1}$ (C/16 in FIG. 1) are connected, i.e., when n+1 capacitors (six capacitors in FIG. 1) are connected, the total capacitance is 2C.

There are provided n+3 switches SA, SB, S4 to S0, and S0' (eight switches in FIG. 1) for controlling the connections of the individual capacitors, and MOS-transistors are used for the switches. Switches SA, SB, S4 to S0, and S0' are controlled so that the voltage comparator can provide the appropriate steering of the switches through auxiliary logic circuitry.

The conversion process is performed in three steps: the sample mode, the hold mode, and the redistribution mode (in which the actual conversion is performed). FIG. 2 is a diagram for depicting a sample operation and a hold operation in the A/D converter of FIG. 1, FIG. 2(a) depicts the sample operation (sample mode), and FIG. 2(b) depicts the hold operation (hold mode).

Firstly, as depicted in FIG. 2(a), in the sample mode, switch SA is closed and switch SB is switched to the input voltage Vin. The remaining switches S4 to S0, and S0' are connected to the common bus B. Due to charging, a total charge of Qin=−2C×Vin is stored on the lower plates of the capacitors.

Next, as depicted in FIG. 2(b), in the hold mode, switch SA is opened while the switches S4 to S0, and S0' are connected to ground, thereby applying a voltage of Vc=−Vin to the comparator input. This means that the circuit already has a built-in sample-and-hold element.

FIG. 3 is a diagram for depicting conversion step operations in the A/D converter of FIG. 1. FIG. 3(a) depicts the determination of the most significant bit (MSB; bit 4), FIG. 3(b) depicts the case when bit 4=1, and FIG. 3(c) depicts the case when bit 4=0.

The actual analog-to-digital conversion (A/D conversion), in which the analog input voltage Vin is converted to a digital signal, is performed by the (charge) redistribution mode. Firstly, the first conversion step, depicted in FIG. 3(a), connects C (the largest capacitor) via switch S4 to the reference voltage Vref, which corresponds to the full-scale range (FSR) of the A/D converter (ADC).

Capacitor C forms a 1:1 capacitance divider with the remaining capacitors connected to ground. The comparator input voltage is Vc=−Vin+Vref/2. When Vin>Vref/2, then Vc<0, and the comparator output goes up to the high level "1", providing the most significant bit MSB (bit 4)=1. On the other hand, when Vin<Vref/2, then Vc>0, and the comparator output goes down to the low level "0", providing bit 4=0.

As depicted in FIG. 3(b) and FIG. 3(c), the second conversion step connects C/2 to Vref. When the first conversion step resulted in bit 4=1, switch S4 is connected to ground again to discharge C, as depicted in FIG. 3(b).

On the other hand, as depicted in FIG. 3(c), when the first conversion step resulted in bit 4=0, switch S4 remains connected to Vref, resulting in a comparator input voltage of Vc=Vin+bit 4−Vref/2+Vref/4.

According to this voltage, the next most significant bit (bit 3) is obtained by comparing Vin to ¼ Vref or ¾ Vref through the different voltage dividers. In other words, switch S3 is either connected to ground when bit 3=1, thereby discharging C/2, or S3 remains connected to Vref when bit 3=0.

This process continues until all bits are generated, with the final conversion step being performed at a comparator input voltage of Vc=−Vin+bit 4×Vref/2 bit 3×Vref/4+bit 2×Vref/8+bit 1×Vref/16+bit 0×Vref/32.

The successive approximation register type A/D converter depicted in FIG. 1 to FIG. 3 is a single-ended circuit, and the present example is also applicable to differential A/D converters, as will be described in detail later.

As described above, the successive approximation register type A/D converter (SAR-ADC) includes a capacitive digital-to-analog (D/A) conversion unit disposed in the input unit thereof, thereby switching over switches SA, SB, S4 to S0, and S0' among the sample mode, the hold mode, and charge redistribution mode.

Therefore, when the A/D conversion of the significant bit, especially, the A/D conversion of the most significant bit (MSB) is performed, it takes a long settling time because of a large amount of charge to be redistributed by the capacitive D/A conversion unit, resulting in the high probability of erroneous determination.

In other words, missing code, i.e., the state where some of the digital codes corresponding to the analog inputs are not output, may occur.

Patent Document 1: Japanese Laid-open Patent Publication No. 2003-283336

Non-Patent Document 1: Thomas KUGELSTADT, "Operations of Charge Redistribution type SAR-ADC," JAJT017 (Japanese Translation of SLYT176), Texas Instruments Incorporated (Japanese version: Texas Instruments Japan Limited), pp. 1-4, November 2001, Searched Date: Nov. 9, 2013 Internet <URL: http://www.tij.co.jp/jp/lit/an/jajt017/jajt017.pdf>

SUMMARY

According to an aspect of the embodiments, there is provided an A/D converter includes an A/D conversion unit, a histogram generation-storage unit, and a control unit.

The A/D conversion unit is configured to receive an input voltage, perform an analog-to-digital conversion, and output digital data, and the histogram generation-storage unit is configured to receive the digital data, generate a histogram for a waveform of the input voltage, and store the generated histogram therein. The control unit is configured to control an analog-to-digital conversion characteristic of the A/D conversion unit, based on the histogram stored in the histogram generation-storage unit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2 is a diagram for depicting a sample operation and a hold operation in the A/D converter of FIG. 1;

FIG. 3 is a diagram for depicting conversion step operations in the A/D converter of FIG. 1;

FIG. 6 is a diagram (no. 2) for depicting a problem in the A/D converter;

FIG. 15 is a circuit diagram depicting an example of a comparator in the main part of the A/D converter depicted in FIG. 14.

DESCRIPTION OP EMBODIMENTS

Before describing the examples in detail of an A/D converter and an A/D converter calibrating method, an example of a signal transmission system in which an A/D converter is applied, and problems in the A/D converter will be described referring to FIG. 4 to FIG. 6.

Figure 4:
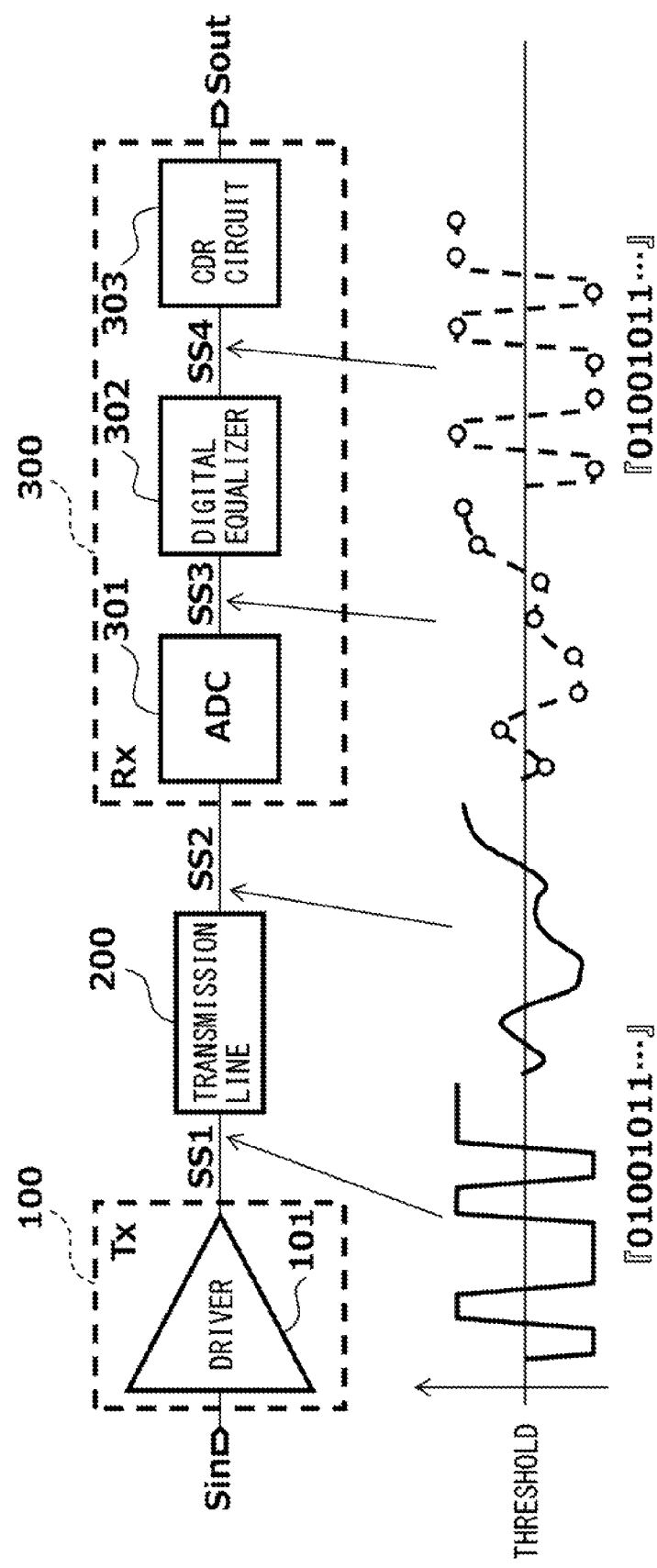
FIG. 4 is a diagram for depicting an example of a signal transmission system in which an A/D converter is applied.

FIG. 4 is a diagram depicting an example of a signal transmission system in which an A/D converter is applied. In FIG. 4, referential numeral 100 refers to a transmission circuit (Tx), 200 refers to a transmission line, and 300 refers to a reception circuit (Rx).

The signal transmission system depicted in FIG. 4 is applied to, for example, backplane transmission using a plurality of mutually connected circuit boards on which CPUs, memories and the like are mounted, or to signal transmission among a plurality of semiconductor integrated circuits that are mounted on a single circuit board. Further, the signal transmission system depicted in FIG. 4 is also applicable to, for example, signal transmission among circuit blocks in a single semiconductor integrated circuit.

As depicted in FIG. 4, the transmission circuit 100 includes a driver 101, and the reception circuit 300 includes an A/D converter (ADC) 301, a digital equalizer 302 and a clock and data recovery (CDR) circuit 303.

The driver 101, for example, receives input signal Sin and outputs transmission signal (digital signal) SS1 to the transmission line 200. The transmission line 200 is, for example, a metal wiring line that connects a plurality of circuit boards to each other, and due to the frequency characteristics of the transmission line 200, the waveform of transmission signal SS1 is deteriorated by losing the high-frequency components. In other words, signal SS2 to be input to the reception circuit 300 from the transmission line 200 has a blunt waveform, i.e., a gradually-changing analog-like waveform.

The A/D converter 301 receives signal SS2 and performs analog-to-digital conversion (A/D conversion), and outputs signal SS3 (signal of the dotted portions) to the digital equalizer 302. The digital equalizer 302 receives signal SS3 from the A/D converter 301, performs, for example, the equalization process for compensating for the deterioration of the signal waveform due to the transmission line 200, and outputs data signal (digital signal) SS4.

The digital equalizer 302 may be provided in, for example, the transmission circuit 100 to perform the process on transmission signal SS1 in advance so as to cancel the deterioration of the signal waveform due to the transmission line 200.

Data signal SS4 subjected to the equalization process is input to the clock and data recovery circuit 303, recovers, for example, the data having been transmitted with clock, signals and the data separated, and outputs the same as signal Sout.

In other words, the clock and data recovery circuit 303 performs timing extraction from data signal SS4 after the equalization process and performs sampling at appropriate timings by adjusting the phases of the sampling clocks in the A/D converter 301, thereby enabling the recovery of correct data.

Therefore, for example, input signal Sin ('01001011 . . . ') to the transmission circuit 100 is transmitted via the transmission line 200 as output signal Sout ('01001011 . . . ') from the reception circuit 300.

When, for example, the degree of the deterioration of the waveform due to the transmission line 200, or depending on the frequency characteristics of the transmission line 200 or the bit rate (transmission rate) of transmission signal SS1, the digital equalizer 302 may be eliminated.

As the A/D converter 301, various types, such as a flash type, pipeline type and SAR type, may be employed. Due to the advantage in low power consumption, SAR type A/D converters have been attracting attention, for example.

Figure 5:
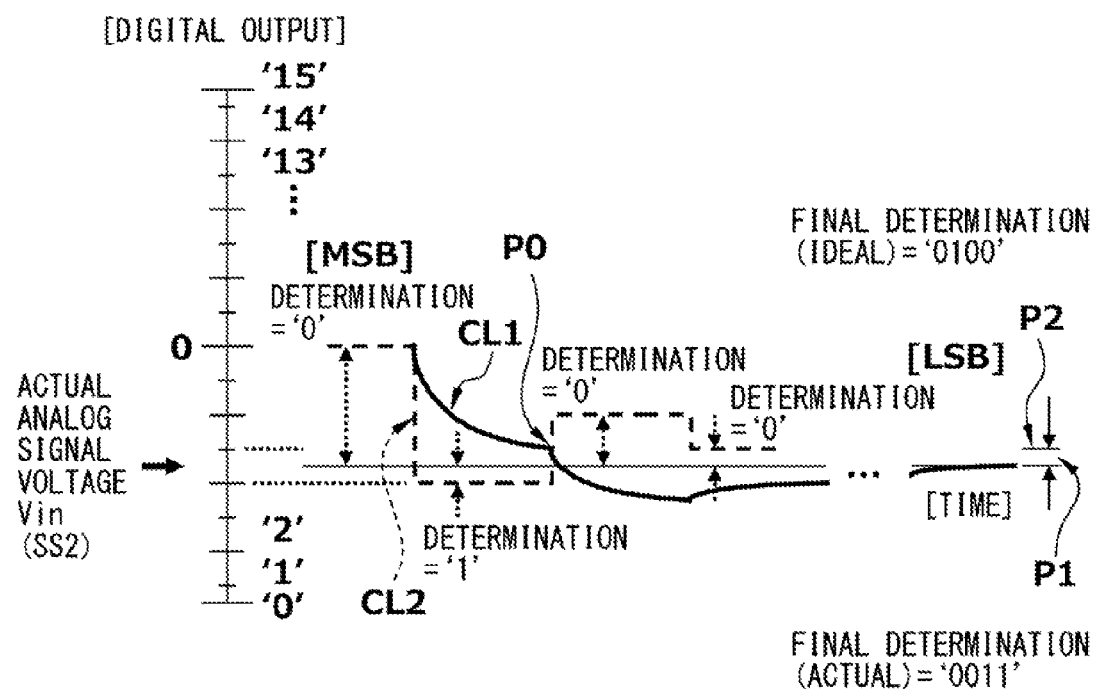
FIG. 5 is a diagram (no. 1) for depicting a problem in the A/D converter.

FIG. 5 is a diagram for depicting a problem in the A/D converter, and depicts the relationship between input signal SS2 (actual analog signal voltage Vin) and a determination value (digital-converted code) of the A/D converter 301.

In FIG. 5, referential sign CL1 refers to a waveform of the actual analog signal voltage (input voltage) Vin, and depicts a transient response waveform of the D/A converter output level (comparator input node voltage: corresponding to Vc in FIG. 1) in each of conversion steps with respect to input voltage Vin.

Referential sign CL2 (broken line) depicts an ideal waveform. In FIG. 5, '0' to '15' on the vertical axis indicate the digital outputs represented by decimal numbers, 0 on the middle indicates the half of the full scale, and the horizontal axis indicates time.

As depicted in waveform CL2 in FIG. 5, a case wherein a data waveform '0100 . . . ' with ideal steep rising and falling edges is A/D converted by, for example, a SAR-ABC (A/D converter 301) based on charge redistribution as described referring to FIG. 1 to FIG. 3 will be considered.

In this case, the comparator input node voltage (corresponding to Vc in FIG. 1) does not steeply change, and, for example, the band that is defined by a capacitance and a resistance to be connected to the input node of the comparator is finite, thereby causing the probability of settling shortage.

In other words, when the settling time is not short enough compared with time for each conversion step, before a correct digital converted value is obtained in a conversion step operation, another conversion step operation subsequent thereto is started, and therefore erroneous determination may probably be made. The influence of such shortage is larger in the significant bits having a large amount of charge to be redistributed by the capacitive D/A conversion unit, and when the A/D conversion of the most significant bit (MSB) is performed, there is a high probability of erroneous determination for this reason.

As described by referring to FIG. 4, transmission signal SS1 from the transmission circuit 100 is deteriorated by, for example, losing the high-frequency components due to the frequency characteristics of the transmission line 200, and is a gradually-changing analog-like waveform (SS2) to be input to the reception circuit 300 (A/D converter 301).

This makes it difficult, together with the charge to be redistributed by the capacitive D/A conversion unit, for the A/D converter 301 to perform an accurate data reception by correctly A/D converting reception signal SS2.

FIG. 5 depicts the case where reception signal SS2 (input voltage Vin), the ideal final determination value of which is '0100 . . . ', actually became a final determination value of '0011 . . . '. In other words, FIG. 5 depicts the case in which settling shortage occurs due to the time insufficiency at position P0, where the second most significant bit (coming next to the most significant bit (MSB) is determined, and data '1' is erroneously determined as '0'.

Thus, for example, when erroneous determination occurs at the second most significant bit, the lower-order bits, i.e., the third and subsequent most significant bits are not capable of correcting the erroneous determination, and wide code '0011 . . . 1111' is output within P1 when the A/D converter 301 is of high resolution.

Alternatively, for example, when the A/D converter 301 is of high resolution, missing codes '0100 . . . 0xxx' to '0100 . . . 0000' are output at position P2. As described above, erroneous determination due to the settling shortage may easily occur on the MSB side and may hardly occur on the least significant bit (LSB) side. Therefore, such erroneous determination is most likely to occur when determining the MSB that has the largest fluctuation value of the comparator input node voltage.

FIG. 6 is a diagram for depicting a problem in the A/D converter. FIG. 6(a) depicts the relationship between the output signal SS3 (Dout) and the actual analog signal voltage (input voltage) Vin (SS2) of the A/D converter 301, and FIG. 6(b) depicts the relationship between the density (frequency of appearance) and the output signal SS3 of the A/D converter 301.

In other words, FIG. 6(a) is, for example, when the A/D converter 301 has characteristic as depicted in FIG. 5, obtained by plotting output digital code Dout from the A/D converter 301 against the input voltage Vin having a fixed slope (dVin/dt). The input voltage Vin having a fixed slope corresponds to, for example, a triangle wave (WFc) that is generated by a calibration waveform generation unit 5 of the present exemplary embodiment to be described later.

As depicted as P3 in FIG. 6(a), for example, when erroneous determination occurs at position P0 in FIG. 5, wide code, i.e., the state where the output code Dout has a fixed value for a predetermined range of the input voltage Vin, is observed.

As depicted as P4 in FIG. 6(b), for example, by plotting the frequency of appearance of the output digital code Dout from the A/D converter 301 in the case of FIG. 6(a), jump points (where no code is present: missing codes) appear in the output digital code Dout.

FIG. 6(b) corresponds to a histogram HG in FIG. 8 to be described later, and depicts the case in which missing codes have appeared in two adjacent data sections indicated by P4. The missing codes that have appeared in P4 are added, for example, to a code that has appeared in a data section adjacent to P4 (data section of the adjacent higher-order bit in FIG. 6(b)).

Thus, in SAR type A/D converters, for example, missing code, i.e., the state where some of the digital codes corresponding to the analog inputs are not output, may occur, thereby causing the probability of lowering the accuracy of analog-to-digital conversion.

Figure 7:
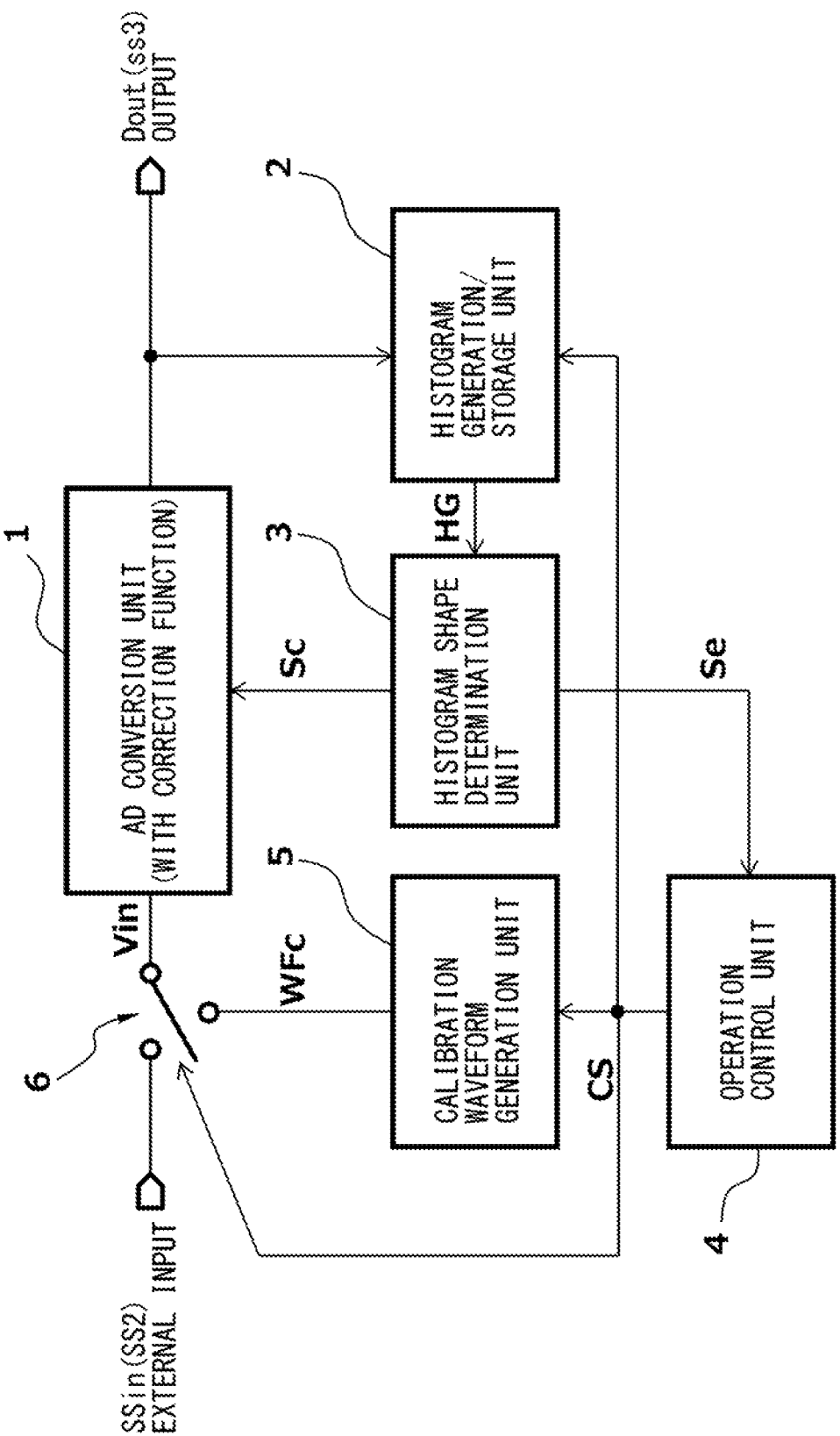
FIG. 7 is a block diagram depicting an A/D converter according to the present exemplary embodiment.

Hereinafter, examples of an A/D converter and an A/D converter calibrating method will be described in detail referring to the accompanying drawings. FIG. 7 is a block diagram depicting an A/D converter according to the present exemplary embodiment.

As depicted in FIG. 7, the A/D converter of the present exemplary embodiment includes an A/D conversion unit 1, a histogram generation-storage unit 2, a histogram shape determination unit 3, an operation control unit 4, a calibration waveform generation unit 5, and input switch-over switch 6.

The A/D conversion unit 1 corresponds to, as will be described later, a successive approximation register type A/D converter (SAR-ADC) provided with a correction function, receives an input voltage Vin selected by the input switch-over switch 6 and performs analog-to-digital conversion (A/D conversion), and outputs an output Dout (SS3) of a predetermined bit.

The calibration waveform generation unit 5 and the A/D conversion unit 1 operate asynchronously. Specifically, assuming that, for example, the operating frequency of the calibration waveform generation unit 5 and the operating frequency of the A/D conversion unit 1 are respectively set to T0 and T1, where $T1=T0+T0/2^N$, in an N-bit A/D converter, then sampling (A/D conversion) of all the voltage levels can be performed at an equal interval in a predetermined time ($2^N*T1$).

The histogram generation-storage unit 2 receives the output Dout from the A/D conversion unit 1, generates a histogram (HG), and stores the same therein. The histogram shape determination unit 3 receives the histogram HG from the histogram generation-storage unit 2 to perform shape determination, generates a correction signal Sc for outputting to the A/D conversion unit 1, and generates an error signal Se for outputting to the operation control unit 4.

The correction signal Sc is, for example, a signal for correcting the characteristics of the A/D conversion unit 1 (comparator unit 12) during the calibration process such that the histogram HG obtained from the output Dout approximates a reference histogram HGR.

The error signal Se is, for example, a signal indicating an error between the histogram HG obtained from the output Dout and the reference histogram HGR. When the error is equal to or lower than a permissive value, the correction value of the A/D conversion unit 1 (characteristics of the comparator unit 12) at that point of time is held to end the calibration process.

Figure 8:
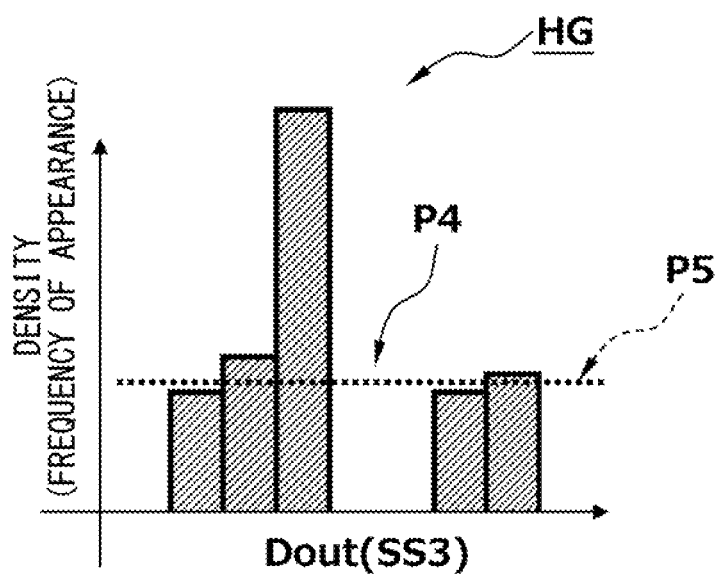
FIG. 8 is a diagram for depicting an example of a histogram in the A/D converter depicted in FIG. 7.

FIG. 8 is a diagram for depicting an example of a histogram in the A/D converter in FIG. 7, and corresponds to the histogram in FIG. 6(*b*) described above. In other words, as depicted in FIG. 8, the histogram HG is a frequency distribution chart in which data sections of the output Dout (SS3) from the A/D conversion unit 1 are represented on the horizontal axis represents, and the density (frequency of appearance) of the output Dout in each of the data sections is represented on the vertical axis, for example.

Specifically, for example, when an output from the calibration waveform generation unit 5 given as an input voltage Vin to the A/D conversion unit 1 is a triangle wave, i.e., a voltage wave form having a fixed slope, the histogram HG results in a shape as in FIG. 8.

In other words, the histogram HG in FIG. 8 depicts the case in which missing codes have appeared in two adjacent data sections indicated by P4, and the missing codes that have appeared in P4 are added to a code that has appeared in a data section of the adjacent higher-order bit.

Specifically, in the example in FIG. 8, the missing codes that have appeared in the data sections indicated by P4 are added to the data section of the adjacent higher-order bit (left side of P4), where the frequency of appearance results in almost three time higher than the others.

The reference histogram HGR for depicting the ideal case of no missing code is observed, as depicted by broken line P5 in FIG. 8, at an identical level of the frequency of appearance (mean frequency) throughout the data sections of the output Dout, for example.

During the calibration process, the histogram generation-storage unit 2, for example, generates the histogram HG from the output Dout that has been obtained by the A/D conversion performed by the A/D conversion unit 1 on the triangle wave WFc from the calibration waveform generation unit 5 (i.e., a histogram for the waveform of the input voltage Vin), and stores the generated histogram HG therein.

The reference histogram HGR for the ideal case of no missing code may be stored in the histogram generation-storage unit 2 in advance. Alternatively, the reference histogram HGR may be included in, for example, the histogram shape determination unit 3, or may be provided from the outside.

The histogram shape determination unit 3, for example, uses the histogram HG generated from the input voltage waveform and the reference histogram HGR to perform shape determination, generates the correction signal Sc for outputting to the A/D converter 1, and generates the error signal Se for outputting to the operation control unit 4.

The histogram shape determination unit 3, for example, generates the correction signal Sc such that the frequency of a specific output code (Dout) does not become extremely high or low, i.e., the histogram HG obtained from the output Dout approximates the reference histogram HGR.

Specifically, the histogram shape determination unit 3, for example, takes an absolute value of the difference between the frequency of each output code Dout-i (i represents $0\text{-}2^{n-1}$) and the mean frequency (P5), and generates the correction signal Sc such that the maximum absolute value is the lowest.

In the above regard, the waveform to be used for the calibration process, i.e., the calibration waveform WFc from the calibration waveform generation unit 5 is not limited to a triangle waveform, but various other waveforms, including a sine wave, are applicable.

For example, when applying a sine wave as the calibration waveform WFc, the histogram shape determination unit 3 uses the histogram HG generated from the output Dout from the A/D conversion unit 1 having received the sine wave input voltage Vin, and the ideal reference histogram HGR corresponding to the sine wave to perform shape determination.

Figure 9:
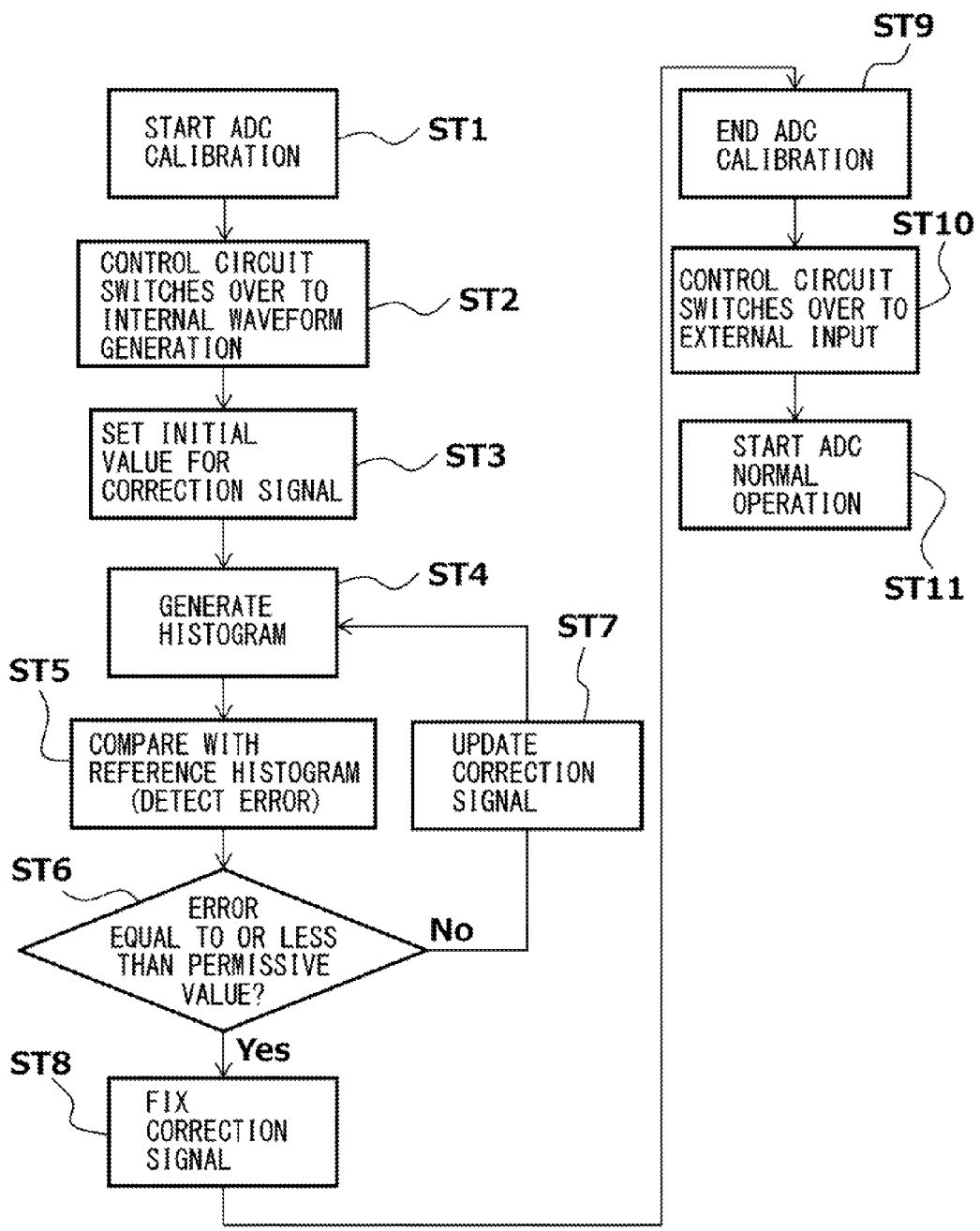
FIG. 9 is a flowchart for depicting an example of a calibrating method in the A/D converter depicted in FIG. 7.

FIG. 9 is a flowchart for depicting an example of a calibrating method in the A/D converter depicted in FIG. 7. As depicted, in FIG. 9, upon starting the calibration process in the A/D converter (ADC) depicted in FIG. 7 in step ST1, the processing proceeds to step ST2, and the operation control unit 4 switches over to internal waveform generation.

In other words, in step ST2, the operation control unit 4, for example, receives a calibration start signal from the outside and controls the switch 6 such that the output signal (calibration waveform) WFc from the calibration waveform generation unit 5 is to be input to the A/D conversion unit 1.

Next, the processing proceeds to step ST3, an initial value for the correction signal Sc to be output from the histogram shape determination unit 3 to the A/D conversion, unit 1 is set, and the processing proceeds to step ST4. In step ST4, the histogram generation-storage unit 2 generates the histogram HG from the output Dout from the A/D conversion unit 1 corresponding to the level changes in the input voltage Vin based on the calibration waveform WFc, and stores the generated histogram HG therein, for example.

Further, the processing proceeds to step ST5, and the comparison (error detection) between the histogram HG stored in the histogram generation-storage unit 2 and the reference histogram HGR is performed. The histogram shape determination unit 3 calculates the error between the stored (generated) histogram HG and the reference histogram HGR, and outputs the error signal Se to the operation control unit 4.

The processing then proceeds to step ST6, and the determination is made as to whether the error between the generated histogram HG and the reference histogram HGR is equal to or less than a predetermined permissive value. In other words, in step ST6, the operation control unit 4 determines whether the error is equal to or less than the permissive value based on the error signal Se from the histogram shape determination unit 3.

In step ST6, when the determination is made that the error between the generated histogram HG and the reference histogram HGR is equal to or less than the permissive value, the processing proceeds to step ST8, and the correction signal Sc is fixed.

On the other hand, in step ST6, when the determination is made that the error is greater than the permissive value, the processing proceeds to step ST7, the correction signal Sc is updated and the processing returns to step ST4. The same processing will be repeated until the determination is made that the error is equal to or less than the permissive value.

When the correction signal Sc is fixed in step ST8, the processing proceeds to step ST9, and the calibration process in the A/D converter is ended. The processing proceeds to step ST10, and the operation control unit 4 switches over to the external input.

In other words, in step ST10, the operation control unit 4 controls the switch 6 such that the external input SSin (SS2) is to be input to the A/D conversion unit 1. The processing proceeds to step ST11, and the normal operation of the A/D converter is started.

As stated above, according to the present exemplary embodiment, an increase of the bit error rate (BER) attributable to the A/D converter can be limited by, for example, preventing erroneous determination due to the settling shortage in the A/D conversion process.

Figure 10:
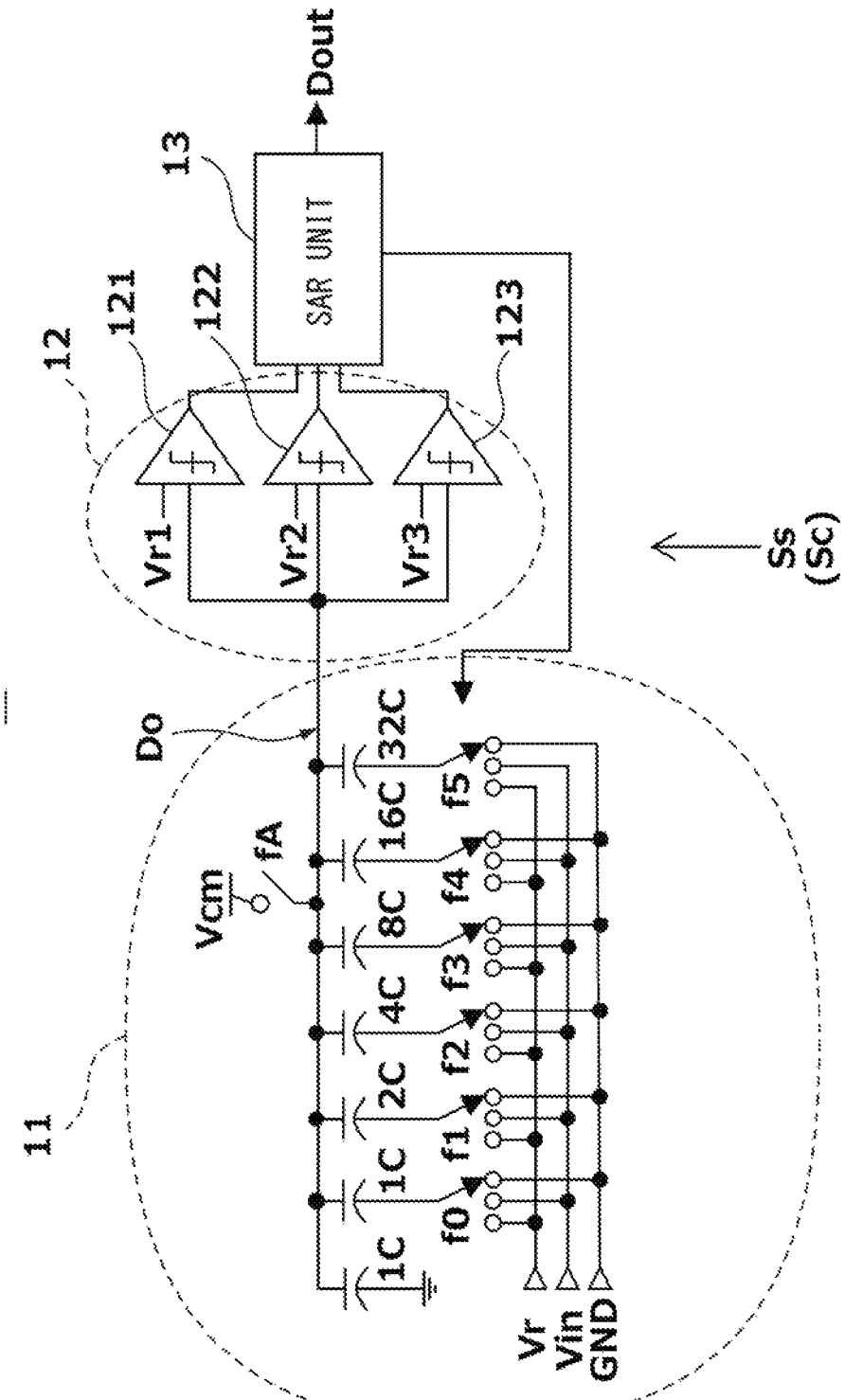
FIG. 10 is a block diagram depicting the main part of a first example of an A/D converter.

FIG. 10 is a block diagram depicting the main part of a first example of an A/D converter, and depicts the A/D conversion unit 1 in FIG. 7. As depicted in FIG. 10, an A/D conversion unit 1 in the A/D converter of the first example includes a capacitive D/A conversion unit 11, a comparator unit 12 and a successive approximation register type A/D conversion unit (SAR unit) 13.

Figure 1:
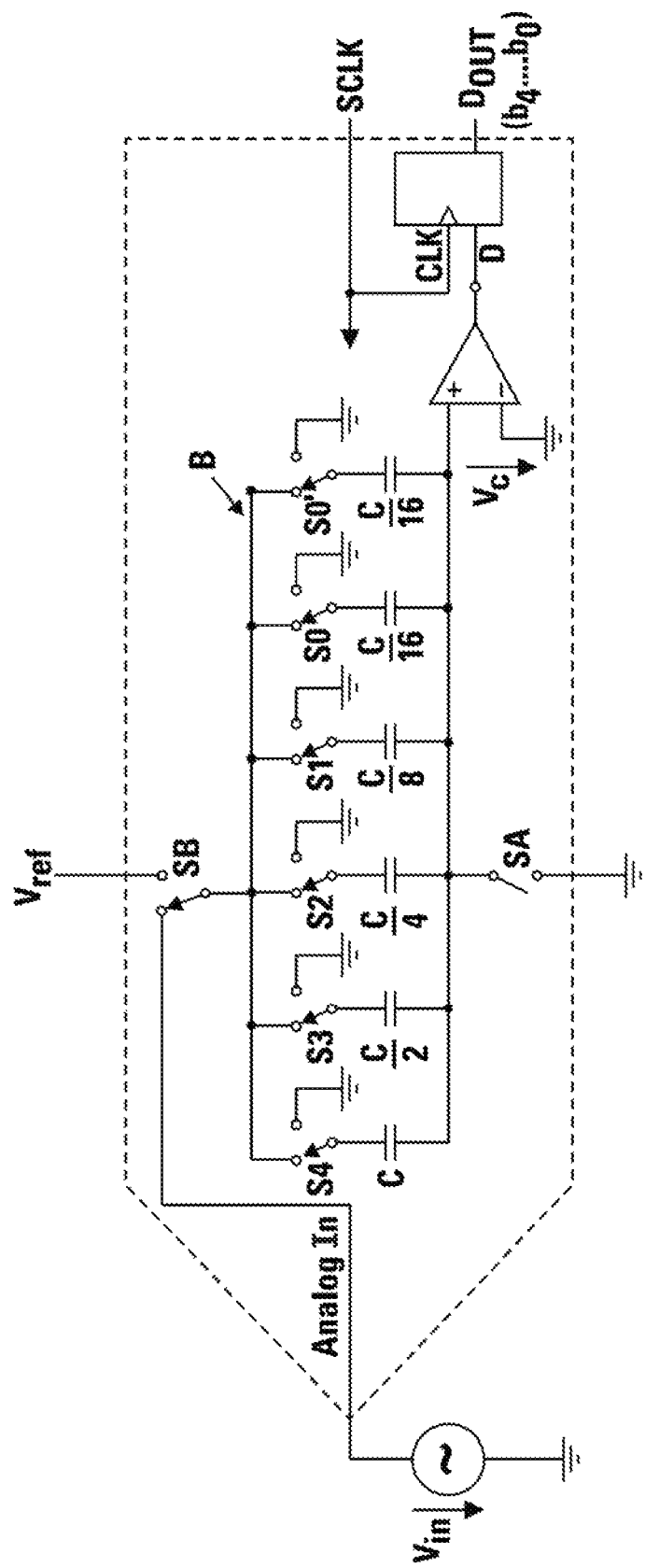
FIG. 1 is a block diagram depicting an example of a conventional A/D converter.

The capacitive D/A conversion unit 11 corresponds to, for example, the capacitive D/A conversion unit in the SAR-ADC described referring to FIG. 1 to FIG. 3. In the present example, however, the number of bits and the configurations of switches, reference voltages and the like are different. For example, capacitor C and capacitor C/16 in FIG. 1 correspond to 32C and 1C in FIG. 10, respectively.

In other words, the capacitive D/A conversion unit 11 includes capacitors each having a binary weighted value (capacitance: 32C, 16C, 8C, ..., 1C, 1C) and switches fA, f5 to f0.

Switching operations performed on switches fA, f5 to f0 control the connections of plates of the individual capacitors to input voltage Vin and voltages Vr, GND and Vcm, thereby performing the conversion process (sample mode, hold mode and redistribution mode).

Not only the configuration depicted in FIG. 10 or FIG. 1, but also various configurations are applicable to the capacitive D/A conversion unit 11, and various configurations of the SAR unit 13 are also applicable. Further, various configurations of the capacitive D/A conversion unit 11 and various configurations of the SAR unit 13 are applicable for second to fifth examples to be described later, as well as for the first example depicted in FIG. 10.

In the A/D converter of the first example, as depicted in FIG. 10, the comparator unit 12 includes three comparators 121 to 123, the comparators each having one input thereof supplied with respective different reference voltages Vr1 to Vr3. The reference voltages Vr1 to Vr3 have a relationship of Vr1>Vr2>Vr3, for example. Further, the comparators 121 to 123 each have another input thereof supplied with an output Do from the capacitive D/A conversion unit 11.

The comparator unit 12 in the first example includes these three comparators 121 to 123 having characteristics (comparison characteristics) different from one another, and one of the outputs from the three comparators 121 to 123 is selected in accordance with a correction signal Sc (selection signal Ss) from the histogram shape determination unit 3.

The selected output from the comparator is input to the SAR unit 13 and then output as a digital data Dout.

In other words, as described above, any one of the outputs from the comparators 121 to 123 is selected in accordance with the selection signal Ss output from the histogram shape determination unit 3 such that the histogram HG obtained from the output Dout approximates the reference histogram HGR.

In the first example, the reason for selecting one of the outputs from the three comparators 121 to 123 to which the different reference voltages Vr1 to Vr3 and the output Do from the capacitive D/A conversion unit 11 have been input is that settling shortage caused by the comparators is prevented from occurring.

Consequently, according to the A/D converter of the first example, a plurality of comparators need to be prepared, but the selection of a comparator in accordance with the selection signal Ss (correction signal Sc) can be performed instantaneously. It should be noted that the number of the comparators is not limited to three.

Figure 11:
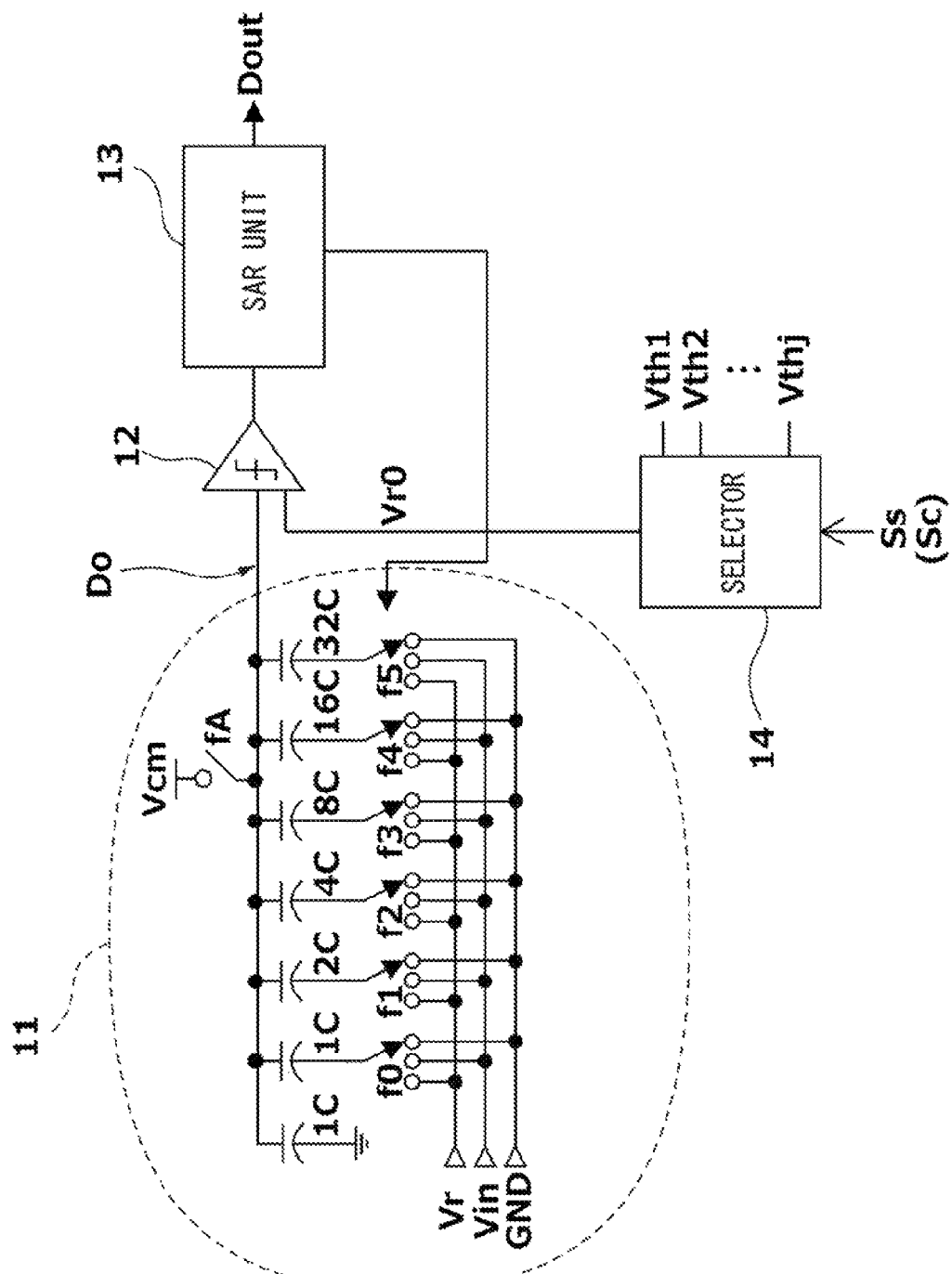
FIG. 11 is a block diagram depicting the main part of a second example of an A/D converter.

FIG. 11 is a block diagram depicting the main part of a second example of an A/D converter, and depicts the A/D conversion unit 1 in FIG. 7. As depicted in FIG. 11, a comparator unit in the A/D converter of the second example includes a single comparator 12, and an output from a selector 14 is used as a reference voltage Vr0 for the comparator 12.

In other words, different j threshold voltages Vth1 to Vthj are input to the selector 14, and a threshold voltage selected in accordance with the correction signal Sc (selection signal Ss) from the histogram shape determination unit 3 is applied as a reference voltage Vr0 for the comparator 12.

The A/D converter of the second example has a reduced circuit scale because the comparator unit includes the single comparator 12, but the comparison operation to be performed by the comparator 12 in accordance with the threshold voltage selected by the selector 14 is slower than in the first example described above. Therefore, the second example is preferably employed when, for example, there is enough time available for initialization operation (calibration process) performed when the device provided with the A/D converter is turned on or the like.

Figure 12:
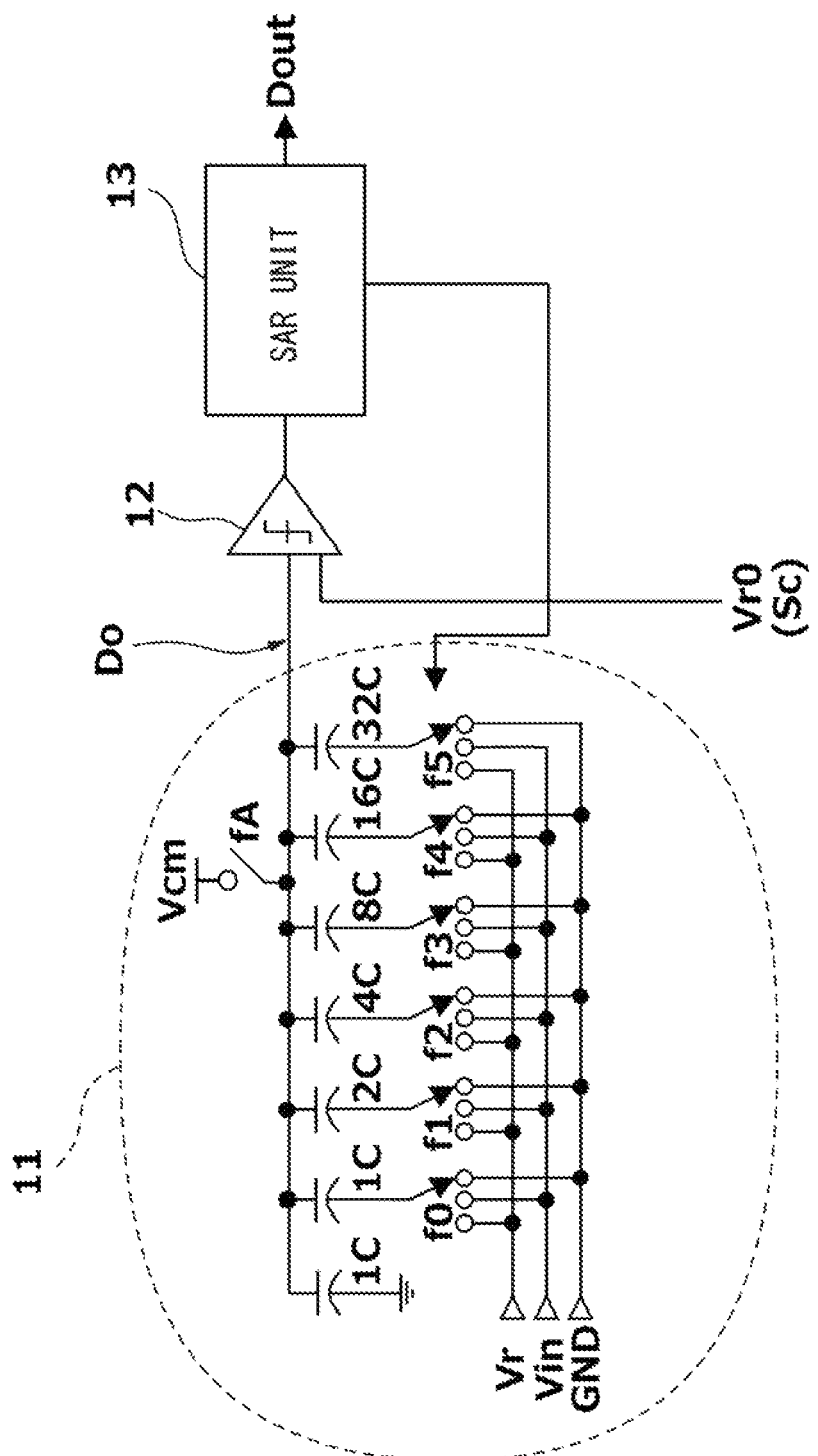
FIG. 12 is a block diagram depicting the main part of a third example of an A/D converter.

FIG. 12 is a block diagram depicting the main part of a third example of an A/D converter, and depicts the A/D conversion unit 1 in FIG. 7.

As apparent from the comparison between FIG. 12 and FIG. 11, a comparator unit in the A/D converter of the third example includes a single comparator 12, and the correction signal Sc from the histogram shape determination unit 3 is used as a reference voltage Vr0 for the comparator 12. Accordingly, the A/D converter of the third example is preferably employed when, for example, there is enough time available for calibration process, as is in the second example described above.

Figure 13:
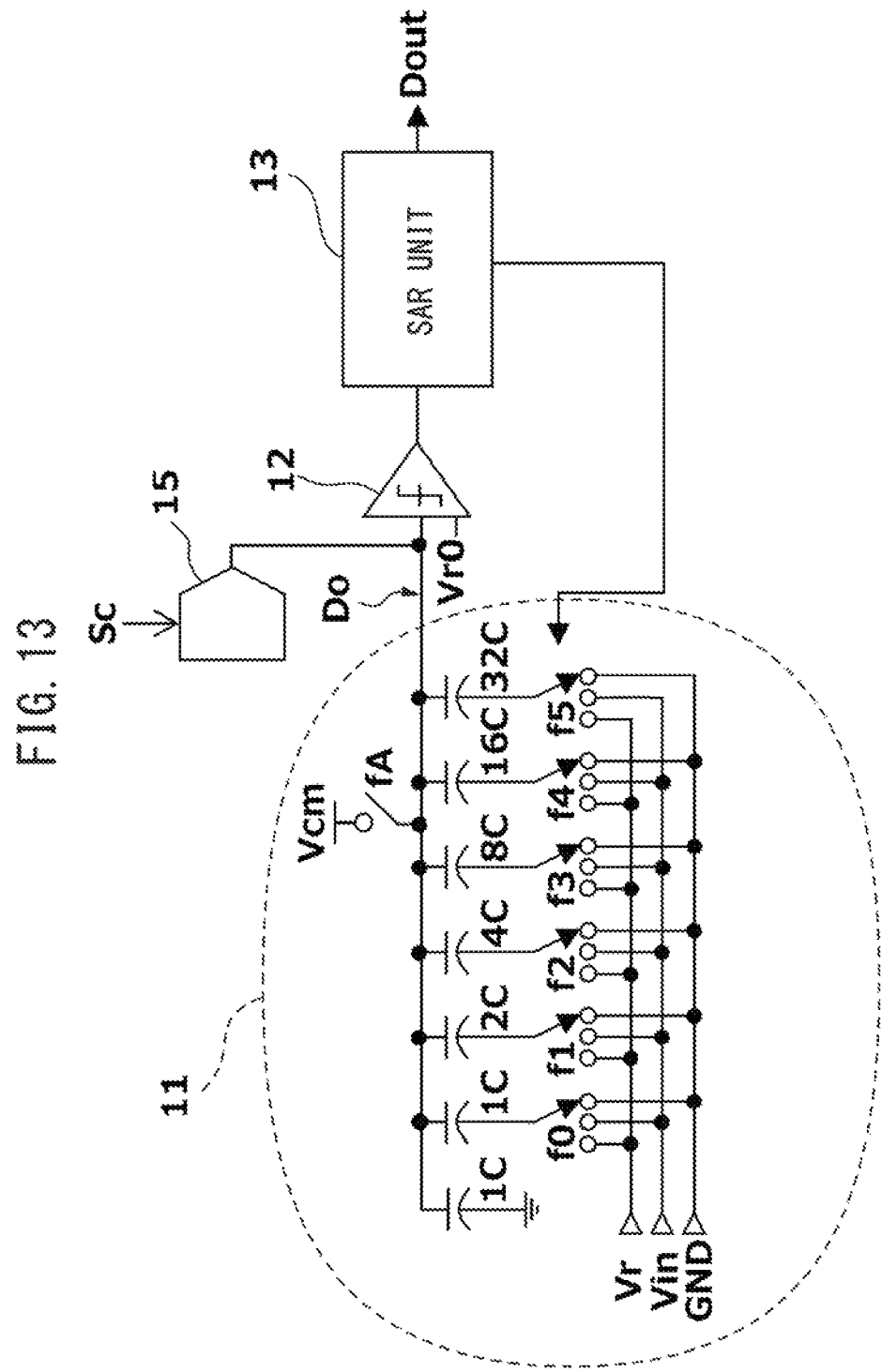
FIG. 13 is a block diagram depicting the main part of a fourth example of an A/D converter.

FIG. 13 is a block diagram depicting the main part of a fourth example of an A/D converter, and depicts the A/D conversion unit 1 in FIG. 7.

As depicted in FIG. 13, a comparator unit in the A/D converter of the fourth example includes a single comparator 12, and a reference voltage Vr0 for the comparator 12 has a fixed value. A capacitive D/A conversion unit 15 that is controlled by the correction signal Sc from the histogram shape determination unit 3 is provided for the output Do from the capacitive D/A conversion unit 11.

In other words, in the A/D converter of the third example, the comparison characteristics is corrected by providing, for the input node (Do) to the comparator 12, the capacitive D/A conversion unit 15 that is controlled by the correction signal Sc, instead of by varying the threshold value (reference voltage Vr0) for the comparator 12.

Accordingly, the A/D converter of the fourth example has an advantage of being able to perform the A/D conversion without interference with the basic operations, because merely the capacitive D/A conversion unit 15 needs to be provided for the input node to the comparator 12.

Figure 14:
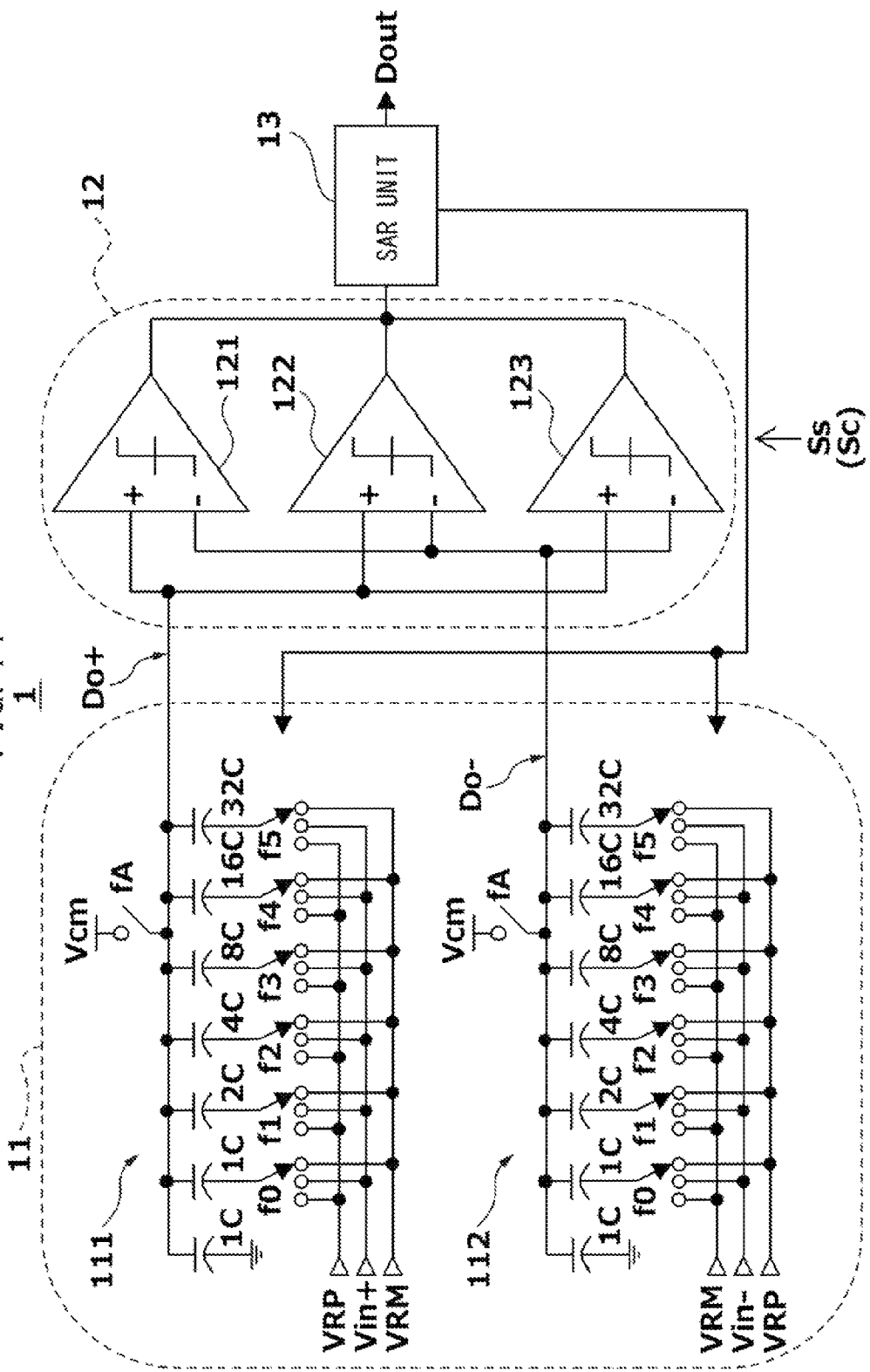
FIG. 14 is a block diagram depicting the main part of a fifth example of the A/D converter.

FIG. 14 is a block diagram depicting the main part of a fifth example of the A/D converter, and depicts the A/D conversion unit 1 in FIG. 7.

The A/D converter of the fifth example is of differential configuration, and a capacitive D/A conversion unit 11 includes a capacitive D/A conversion unit 111 for positive logic input voltage Vin+ and a capacitive D/A conversion unit 112 for negative logic input voltage Vin−. A comparator unit 12 includes three comparators 121 to 123 similar to the first example described referring to FIG. 10.

Each of the comparators 121 to 123 has one input (+) connected to an output Do+ from the capacitive D/A conversion unit 111 for positive logic input voltage Vin+, and the other input (−) connected to an output Do− from the capacitive D/A conversion unit 112 for negative logic input voltage Vin−.

FIG. 15 is a circuit diagram depicting an example of a comparator 121 (122 and 123 as well) in the main part of the A/D converter depicted in FIG. 14, wherein the comparison characteristics are controlled by varying the number of transistors in FIG. 15(a) and by varying the values of variable capacitors in FIG. 15(b).

In other words, as depicted in FIG. 15(a), the comparator 121 includes differential pair transistors Trp and Trn for receiving differential inputs INp and INn (corresponding to the outputs Do+ and Do−), and in parallel therewith, transistors Trpc, Trnc for offset voltage control.

There are provided a plurality of transistors Trpc, Trnc for offset voltage control, and the number of the transistors Trpc, Trnc to be connected is varied among the comparators 121 to 123. The comparison characteristics may be varied by means of an asymmetrical connection with respect to the differential inputs INp and INn such as only transistor Trpc being connected and transistor Trnc being disconnected, for example.

Further, as depicted in FIG. 15(b), a load capacity in the comparator 121 between GND (ground voltage) and a drain of the differential pair transistors Trp and Trn for receiving the differential inputs INp and INn (corresponding to outputs Do+ and Do−) may be varied between variable capacitors CVp and CVn.

Consequently, the comparators 121 to 123 in the comparator unit 12 only need to have different comparison characteristics, and any one of the outputs from the comparators 121 to 123 is selected in according with the selection signal Ss (correction signal Sc) and is input to the SAR unit 13 on the subsequent stage. The number of the comparators is not limited to three as has been described above.

In the above description, the A/D converters in the examples can be applied with a single-ended configuration or a differential configuration. Further, the number of bits to be converted from an analog signal to a digital signal, as well as the type of a calibration waveform, and the configurations of an A/D conversion unit, a histogram generation-storage unit, a histogram shape determination unit, an operation control unit and the like can be designed variously.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An A/D converter comprising:
an A/D conversion unit configured to receive an input voltage, perform an analog-to-digital conversion, and output digital data;
a histogram generation-storage unit configured to receive the digital data, generate a histogram for a waveform of the input voltage, and store the generated histogram therein; and
a control unit configured to control analog-to-digital conversion characteristics of the A/D conversion unit, based on the histogram stored in the histogram generation-storage unit, wherein
the control unit includes:
a histogram shape determination unit configured to read the histogram stored in the histogram generation-storage unit to perform a shape determination, output an error signal between the histogram and a preset reference histogram, and output a correction signal for correcting the analog-to-digital conversion characteristics of the A/D conversion unit; and
an operation control unit configured to receive the error signal to control a calibration operation,
the A/D conversion unit includes:
a capacitive D/A conversion unit configured to receive the input voltage and switch over a plurality of capacitors and switches to perform a digital-to-analog conversion;
a comparator unit configured to compare voltages of outputs from the capacitive D/A conversion unit; and
a successive approximation register type A/D conversion unit configured to output the digital data, based on a comparison result of the comparator unit, and
the comparator unit includes:
a plurality of comparators including comparison characteristics different from one another,
each of the plurality of comparators receives the voltage of the output from the capacitive D/A conversion unit, and
any one of the plurality of comparators is selected in accordance with the correction signal from the histogram shape determination unit, and an output from the selected comparator is output to the successive approximation register type A/D conversion unit.

2. The A/D converter according to claim 1, the A/D converter further comprising:
a calibration waveform generation unit configured to generate a calibration waveform; and
an input switch-over switch configured to select the calibration waveform or an external input as the input voltage.

3. The A/D converter according to claim 2, wherein the operation control unit controls the histogram generation-storage unit, the calibration waveform generation unit and the input switch-over switch in accordance with the error signal.

4. The A/D converter according to claim 2, wherein the calibration waveform is a triangle wave or a sine wave.

5. The A/D converter according to claim 1, wherein the plurality of comparators include reference voltages different from one another.

6. The A/D converter according to claim 1, wherein
the A/D converter is of differential configuration,
the capacitive D/A conversion unit includes a capacitive D/A conversion unit for positive logic and a capacitive D/A conversion unit for negative logic,
each of the plurality of comparators receives an output from the capacitive D/A conversion unit for positive logic and an output from the capacitive D/A conversion unit for negative logic, and
any one of the plurality of comparators is selected in accordance with the correction signal from the histogram shape determination unit, and an output from the selected comparator is output to the successive approximation register type A/D conversion unit.

7. The A/D converter according to claim 6, wherein the plurality of comparators include offset voltages different from one another.

8. The A/D converter according to claim 6, wherein the plurality of comparators include load capacities different from one another.

9. The A/D converter according to claim 1, the A/D converter further comprising a capacitive D/A conversion unit for correction, which is provided on the output of the capacitive D/A conversion unit, configured to correct a capacitance value of the output from the capacitive D/A conversion unit in accordance with the correction signal from the histogram shape determination unit.

10. An A/D converter comprising:
an A/D conversion unit configured to receive an input voltage, perform an analog-to-digital conversion, and output digital data;
a histogram generation-storage unit configured to receive the digital data, generate a histogram for a waveform of the input voltage, and store the generated histogram therein; and
a control unit configured to control analog-to-digital conversion characteristics of the A/D conversion unit, based on the histogram stored in the histogram generation-storage unit, wherein
the control unit includes:
a histogram shape determination unit configured to read the histogram stored in the histogram generation-storage unit to perform a shape determination, output an error signal between the histogram and a preset reference histogram, and output a correction signal for correcting the analog-to-digital conversion characteristics of the A/D conversion unit; and
an operation control unit configured to receive the error signal to control a calibration operation,
the A/D conversion unit includes:
a capacitive D/A conversion unit configured to receive the input voltage and switch over a plurality of capacitors and switches to perform a digital-to-analog conversion;
a comparator unit configured to compare voltages of outputs from the capacitive D/A conversion unit; and
a successive approximation register type A/D conversion unit configured to output the digital data, based on a comparison result of the comparator unit, and
the comparator unit includes:
a single comparator configured to receive the voltage of the output from the capacitive D/A conversion unit, and
a reference voltage, with which the comparator compares the output from the capacitive D/A conversion unit, is controlled in accordance with the correction signal from the histogram shape determination unit.

11. An A/D converter calibrating method for receiving an input voltage, performing analog-to-digital conversion, and outputting digital data, the A/D converter comprising:
an A/D conversion unit configured to receive an input voltage, perform an analog-to-digital conversion, and output digital data;
a histogram generation-storage unit configured to receive the digital data, generate a histogram for a waveform of the input voltage, and store the generated histogram therein; and
a control unit configured to control analog-to-digital conversion characteristics of the A/D conversion unit, based on the histogram stored in the histogram generation-storage unit, wherein
the control unit includes:
a histogram shape determination unit configured to read the histogram stored in the histogram generation-storage unit to perform a shape determination, output an error signal between the histogram and a preset reference histogram, and output a correction signal for correcting the analog-to-digital conversion characteristics of the A/D conversion unit; and
an operation control unit configured to receive the error signal to control a calibration operation,
the A/D conversion unit includes:
a capacitive D/A conversion unit configured to receive the input voltage and switch over a plurality of capacitors and switches to perform a digital-to-analog conversion;
a comparator unit configured to compare voltages of outputs from the capacitive D/A conversion unit; and
a successive approximation register type A/D conversion unit configured to output the digital data, based on a comparison result of the comparator unit, and
the comparator unit includes:
a plurality of comparators including comparison characteristics different from one another,
each of the plurality of comparators receives the voltage of the output from the capacitive D/A conversion unit, and
any one of the plurality of comparators is selected in accordance with the correction signal from the histogram shape determination unit, and an output from the selected comparator is output to the successive approximation resister type A/D conversion unit,
wherein the A/D converter calibrating method comprises:
selecting a calibration waveform as the input voltage;
analog-to-digital converting the calibration waveform to generate a histogram;
calculating an error between the generated histogram and a preset reference histogram;
correcting analog-to-digital conversion characteristics of the A/D converter such that the error is equal to or less than a predetermined permissive value; and
fixing the corrected analog-to-digital conversion characteristics of the A/D converter and selecting an external input as the input voltage, when the error is equal to or less than the predetermined permissive value.

12. The A/D converter calibrating method according to claim 11, wherein the calibration waveform is a triangle wave or a sine wave.

13. An A/D converter calibrating method for receiving an input voltage, performing analog-to-digital conversion, and outputting digital data, the A/D converter comprising:
   an A/D conversion unit configured to receive an input voltage, perform an analog-to-digital conversion, and output digital data;
   a histogram generation-storage unit configured to receive the digital data, generate a histogram for a waveform of the input voltage, and store the generated histogram therein; and
   a control unit configured to control analog-to-digital conversion characteristics of the A/D conversion unit, based on the histogram stored in the histogram generation-storage unit, wherein
   the control unit includes:
      a histogram shape determination unit configured to read the histogram stored in the histogram generation-storage unit to perform a shape determination, output an error signal between the histogram and a preset reference histogram, and output a correction signal for correcting the analog-to-digital conversion characteristics of the A/D conversion unit; and
      an operation control unit configured to receive the error signal to control a calibration operation,
   the A/D conversion unit includes:
      a capacitive D/A conversion unit configured to receive the input voltage and switch over a plurality of capacitors and switches to perform a digital-to-analog conversion;
      a comparator unit configured to compare voltages of outputs from the capacitive D/A conversion unit; and
      a successive approximation register type A/D conversion unit configured to output the digital data, based on a comparison result of the comparator unit, and
   the comparator unit includes:
      a single comparator configured to receive the voltage of the output from the capacitive D/A conversion unit, and
      a reference voltage, with which the comparator compares the output from the capacitive D/A conversion unit, is controlled in accordance with the correction signal from the histogram shape determination unit, wherein the A/D converter calibrating method comprises:
   selecting a calibration waveform as the input voltage;
   analog-to-digital converting the calibration waveform to generate a histogram;
   calculating an error between the generated histogram and a preset reference histogram;
   correcting analog-to-digital conversion characteristics of the A/D converter such that the error is equal to or less than a predetermined permissive value; and
   fixing the corrected analog-to-digital conversion characteristics of the A/D converter and selecting an external input as the input voltage, when the error is equal to or less than the predetermined permissive value.

14. The A/D converter calibrating method according to claim 13, wherein the calibration waveform is a triangle wave or a sine wave.

* * * * *